(12) United States Patent
Chao et al.

(10) Patent No.: US 11,693,037 B2
(45) Date of Patent: Jul. 4, 2023

(54) METHOD FOR MEASURING ENVIRONMENTAL ELECTROMAGNETIC FIELD

(71) Applicant: NATIONAL TAIWAN UNIVERSITY OF SCIENCE AND TECHNOLOGY, Taipei (TW)

(72) Inventors: Che-Peng Chao, Taipei (TW); Li-Lu Ko, Taipei (TW); Kun-Long Chen, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 3 days.

(21) Appl. No.: 17/586,220

(22) Filed: Jan. 27, 2022

(65) Prior Publication Data

US 2023/0083519 A1 Mar. 16, 2023

(30) Foreign Application Priority Data

Sep. 8, 2021 (TW) .................................. 110133440

(51) Int. Cl.
*G01R 29/08* (2006.01)
*B64C 39/02* (2023.01)

(52) U.S. Cl.
CPC .......... *G01R 29/0871* (2013.01); *B64C 39/02* (2013.01); *G01R 29/0857* (2013.01); *G01R 29/0878* (2013.01); *B64U 2201/10* (2023.01)

(58) Field of Classification Search
CPC ............... G01R 29/08; G01R 29/0857; G01R 29/0871; G01R 29/0878; B64C 39/008; B64U 2201/10

(Continued)

(56) References Cited

U.S. PATENT DOCUMENTS

| 6,922,059 B2 * | 7/2005 | Zank | G01D 9/005 |
| | | | 73/861.12 |
| 7,262,602 B2 * | 8/2007 | Meyer | G01V 3/12 |
| | | | 324/330 |

(Continued)

FOREIGN PATENT DOCUMENTS

| AU | WO 2014146184 A1 * | 10/2015 | ............. G01R 33/00 |
| CN | 107390040 A | * 11/2017 | |

(Continued)

OTHER PUBLICATIONS

CN111665396A English Translation—(Year: 2020).*

*Primary Examiner* — Jay Patidar
*Assistant Examiner* — Sean Curtis
(74) *Attorney, Agent, or Firm* — Bacon & Thomas, PLLC

(57) ABSTRACT

A method employs an unmanned aerial vehicle to carry an electromagnetic field measurement system to overcome environmental obstacles in measuring environmental electromagnetic field. The electromagnetic field measurement system senses the electromagnetic field of a spatial position in the environment to generate a sensing signal, then processes the sensing signal to remove the high-frequency electromagnetic interference generated by the operation of the unmanned aerial vehicle itself from the sensing signal, and converts the processed sensing signal into a digital signal. The digital signal is processed to extract at least one wave according to a fundamental frequency and a harmonic order, thereby removing the low-frequency electromagnetic interference from the digital signal. The extracted wave is employed in calculating an environmental electromagnetic field value of the spatial location.

10 Claims, 3 Drawing Sheets

(58) Field of Classification Search
USPC .............................................. 324/330, 76.11
See application file for complete search history.

(56) References Cited

U.S. PATENT DOCUMENTS

| | | | | |
|---|---|---|---|---|
| 9,037,314 | B2* | 5/2015 | Waite ...................... | G01B 7/00 701/1 |
| 9,285,222 | B2* | 3/2016 | Waite ...................... | G05D 1/10 |
| 10,145,950 | B2* | 12/2018 | Allistair .................. | G01S 7/354 |
| 10,359,786 | B2* | 7/2019 | van Cruyningen .... | G05D 1/106 |
| 10,416,213 | B2* | 9/2019 | Pathak .................. | H01L 23/576 |
| 10,564,649 | B2* | 2/2020 | van Cruyningen .... | B64D 47/08 |
| 2005/0122118 | A1* | 6/2005 | Zank ...................... | G01D 9/005 324/457 |
| 2012/0016538 | A1* | 1/2012 | Waite ...................... | G01B 7/00 701/3 |
| 2015/0226559 | A1* | 8/2015 | Waite ...................... | G01B 7/00 701/23 |
| 2016/0124041 | A1* | 5/2016 | Pathak .................. | H01L 23/576 324/629 |
| 2018/0032088 | A1* | 2/2018 | van Cruyningen .... | G06V 20/10 |
| 2018/0246528 | A1* | 8/2018 | van Cruyningen .... | G05D 1/106 |

FOREIGN PATENT DOCUMENTS

| | | | | | |
|---|---|---|---|---|---|
| CN | 107831413 | A | * | 3/2018 | ............. G01R 31/12 |
| CN | 107831413 | B | * | 11/2019 | ............. G01R 31/12 |
| CN | 110596468 | A | * | 12/2019 | ............. B64C 39/02 |
| CN | 111665396 | A | * | 9/2020 | |
| DE | 102019133226 | A1 | * | 6/2020 | ............. G01R 19/18 |
| RU | 159140 | U1 | * | 2/2016 | |
| WO | WO-2011163143 | A1 | * | 12/2011 | ............... G01B 7/00 |
| WO | WO-2016140985 | A1 | * | 9/2016 | ........... B64C 39/024 |
| WO | WO-2017041070 | A1 | * | 3/2017 | ........... B64C 39/024 |
| WO | WO-2019084862 | A1 | * | 5/2019 | ........... G01C 21/005 |

* cited by examiner

METHOD FOR MEASURING ENVIRONMENTAL ELECTROMAGNETIC FIELD

BACKGROUND OF THE INVENTION (1) Field of the Invention

The present invention relates to a method for measuring environmental electromagnetic field, in particular to a method employing an unmanned aerial vehicle to measure the environmental electromagnetic field.

(2) Description of the Prior Art

Electricity is a basic element of industrialization to modern life. However, with the use of electricity, people may be exposed to electromagnetic fields including: 1) electric field generated by voltage, 2) magnetic field generated by current. The intensity of the electric field may directly depend on the voltage level. The overhead line for high-voltage power transmission produces the largest electric field, which is usually accompanied by a larger magnetic field. More and more studies point out that environmental electromagnetic fields may cause physical harm. In order to prevent possible risks and reduce public misgivings, many countries have formulated environmental electromagnetic field standards and guidelines. In addition, it is a serious issue that electromagnetic fields may interfere with electrical equipment within its coverage, so it is necessary to conduct frequently case studies and discussions in response to practical conditions.

Currently, new heavy electric systems, such as power plants, wind turbines, transmission and distribution lines, electric towers, substations, power test laboratories, rail electrics, etc., are required that their impact on the environmental magnetic field cannot exceed 833 mG. The determination of the environmental magnetic field mainly uses manpower to carry out on-site measurement, to compare the changes of the on-site environmental magnetic field before and after the construction of the heavy electric systems. The on-site measurement basically uses a high-precision electromagnetic field measuring instrument to install on a carrier such as a single-wheel cart that can record the moving distance, then make the carrier go around the measured region to complete the measurement of environmental magnetic field.

However, before the construction of the heavy electric systems, the surveying personnel often encounter the harsh on-site environment, such as uneven roads, dead ends, weeds, ditches, pools, or close proximity to private land. Uneven roads may cause the measurement data of the high-precision electromagnetic field measuring instrument to violently jump; dead ends causes the measurement path to be interrupted and cannot complete a peripheral measurement, which makes the impact assessment report of the environmental electromagnetic field be more controversial; close to private land makes the measurement process easy to cause disputes with the public, and the measurement methods limited.

In response to the development of smart grid construction as well as the increasingly mature unmanned aerial vehicle (hereinafter referred to as UAV) flight technology, more and more power companies are introducing UAVs for transmission line inspections. For example, Hydro-Quebec company introduced UAVs for wire corrosion inspections; Darling Geomatics company introduced UAVs for 3D Mapping geographic information; ULC Robotics company introduced UAVs for image patrol; Cyberhawk Innovations Limited introduced UAVs for image patrol and fan inspection; and other companies focus on temperature detection of transmission lines. However, the UAV itself also generates electromagnetic fields when its motors are running, which interferes with the measurement results of the environmental electromagnetic field.

SUMMARY OF THE INVENTION

One object of the present invention is to provide a method for measuring environmental electromagnetic field, to overcome environmental obstacles in the measurement process and eliminate the electromagnetic field interference of the carrier itself, thereby obtaining more accurate measurement data of environmental electromagnetic field.

In order to achieve the aforementioned object, the present invention provides a method for measuring environmental electromagnetic field, comprising: steps of: disposing an electromagnetic field measurement system on a movable carrier, wherein the electromagnetic field measurement system comprises a sensing module, an analog signal processing module, and a digital signal processing mechanism, wherein the sensing module is selected from the group consisting of an electric field sensor, a magnetic field sensor and a combination thereof to sense an environmental electromagnetic field of a spatial position to generate a sensing signal; having the analog signal processing module remove a high-frequency interference from the sensing signal to retain a first filtered signal, wherein the high-frequency interference has a frequency greater than a first frequency value, and the first frequency value is determined according to an electromagnetic field generated from the operation of the movable carrier itself; and performing the digital signal processing mechanism, comprising steps of: converting the first filtered signal into a digital signal; removing a low-frequency interference from the digital signal to form a second filtered signal, wherein the low-frequency interference has a frequency less than a predetermined second frequency value; and calculating a measured value of the environmental electromagnetic field of the spatial position according to the second filtered signal.

In an embodiment, the first frequency value is 4 kHz, and the predetermined second frequency value is selected from one of 50 Hz and 60 Hz.

In an embodiment, forming the second filtered signal comprises steps of: defining the predetermined second frequency value as a fundamental frequency of a power system; determining a harmonic order corresponding to the fundamental frequency of the power system; and performing Fourier transform on the digital signal to obtain at least one wave according to the fundamental frequency of the power system and the harmonic order.

In an embodiment, the at least one wave obtained by performing Fourier transform has a frequency in the frequency range of 50 Hz to 4 kHz.

In an embodiment, the method further comprises steps of: receiving a satellite positioning information of the spatial position when generating the sensing signal; and marking the satellite positioning information on the measured value of the environmental electromagnetic field.

In an embodiment, the digital signal processing mechanism is executed by an embedded system.

In an embodiment, the method further comprises steps of: disposing an imaging device on the movable carrier; and implementing an image receiver in the embedded system, wherein the image receiver is electrically connected to the imaging device.

In an embodiment, the method further comprises step of: disposing a global positioning system receiver in the embedded system to receive the satellite positioning information.

In an embodiment, the method further comprises steps of: providing an electromagnetic field analysis platform to be connected with the embedded system through wireless communication; predetermining a fundamental frequency and a harmonic order by the electromagnetic field analysis platform; performing Fourier transform on the digital signal to extract the second filtered signal according to the fundamental frequency and the harmonic order through the embedded system; and displaying the measured value of the environmental electromagnetic field on the electromagnetic field analysis platform after the measured value of the environmental electromagnetic field is marked with the satellite positioning information.

In an embodiment, the movable carrier comprises an unmanned aerial vehicle, and the analog signal processing module comprises a low pass filter.

In the present invention, the electromagnetic field measurement system is installed on the UAV to overcome environmental obstacles in the measurement process, and two-stage filtering is adopted to solve the electromagnetic field interference of the UAV itself. Therefore, more stable and accurate measurement data of environmental electromagnetic field can be obtained.

DESCRIPTION OF THE PREFERRED EMBODIMENTS

Regarding technical contents, features and effects disclosed above and other technical contents, features and effects of the present invention will be clearly presented and manifested in the following detailed description of the exemplary preferred embodiments with reference to the accompanying drawings which form a part hereof.

Figure 1:
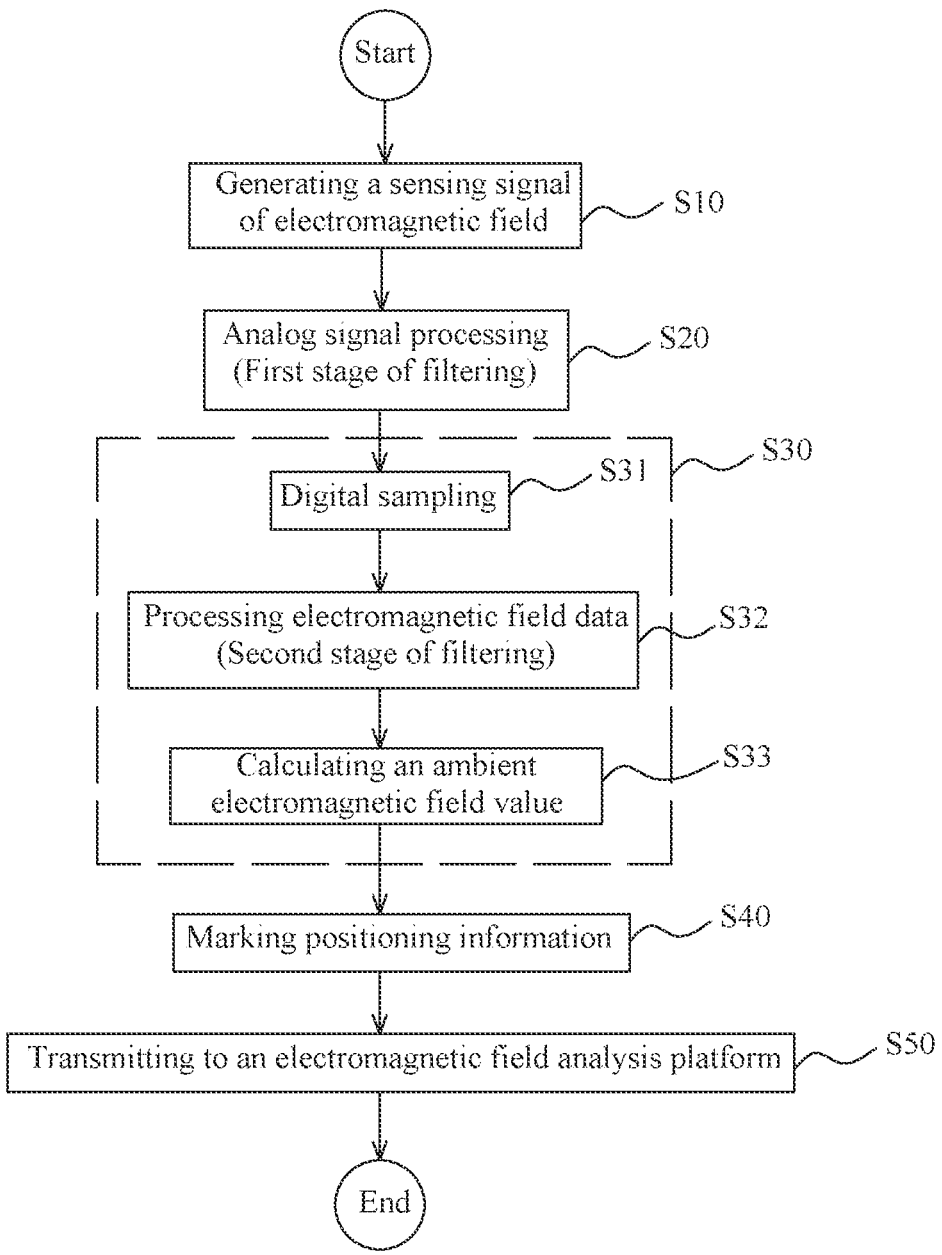
FIG. 1 is a schematic flow chart of a method for measuring environmental electromagnetic field according to an embodiment of the present invention.

FIG. 1 is a flow chart (S10~S50) of a method for measuring environmental electromagnetic field according to an embodiment of the present invention. In the embodiment, an electromagnetic field measurement system is disposed on a movable carrier. The movable carrier and the electromagnetic field measurement system are remotely controlled through an electromagnetic field analysis platform to run the method for measuring environmental electromagnetic field. For the convenience of description, the electric field or/and the magnetic field will be referred to as electromagnetic field for short hereinafter.

The electromagnetic field measurement system provides an electric field sensor or/and a magnetic field sensor to generate a sensing signal of electromagnetic field, which is essentially an analog signal (S10); then performs a first stage of filtering that includes an analog signal processing to remove a high-frequency interference from the sensing signal, and retain a first filtered signal (S20). The removed high-frequency interference mainly comes from the high-frequency electromagnetic field signal generated by the operation of the movable carrier itself, such as the motor operation of the movable carrier.

Next, a digital signal processing mechanism (S30) is executed. The digital signal processing mechanism (S30) includes steps of digitally sampling the first filtered signal (S31) to convert the first filtered signal into a digital signal which includes digitized electromagnetic field data; and processing the digitized electromagnetic field data (S32) referring to a selected fundamental frequency and a harmonic order, to extract at least one wave with a frequency of the integer times the selected fundamental frequency from the digital signal to form a second filtering signal. In other words, the step (S32) may be regarded as a second stage of filtering to remove low-frequency interference from the digital signal, wherein the low-frequency interference includes the electromagnetic field data with a frequency lower than the fundamental frequency of a heavy electric system signal, or the low-frequency electromagnetic field signal derived from the motor operation of the movable carrier itself. Subsequently, the second filtered signal is applied to calculate an ambient electromagnetic field value (S33), which is a measured value including the magnitude of electric intensity, electric flux density, magnetic intensity or/and magnetic flux density. The ambient electromagnetic field value may be further marked with positioning information (S40). Finally, the ambient electromagnetic field value marked with positioning information is transmitted remotely to an electromagnetic field analysis platform (S50). In one embodiment, the electromagnetic field analysis platform is a user operating platform away from the movable carrier.

Figure 2:
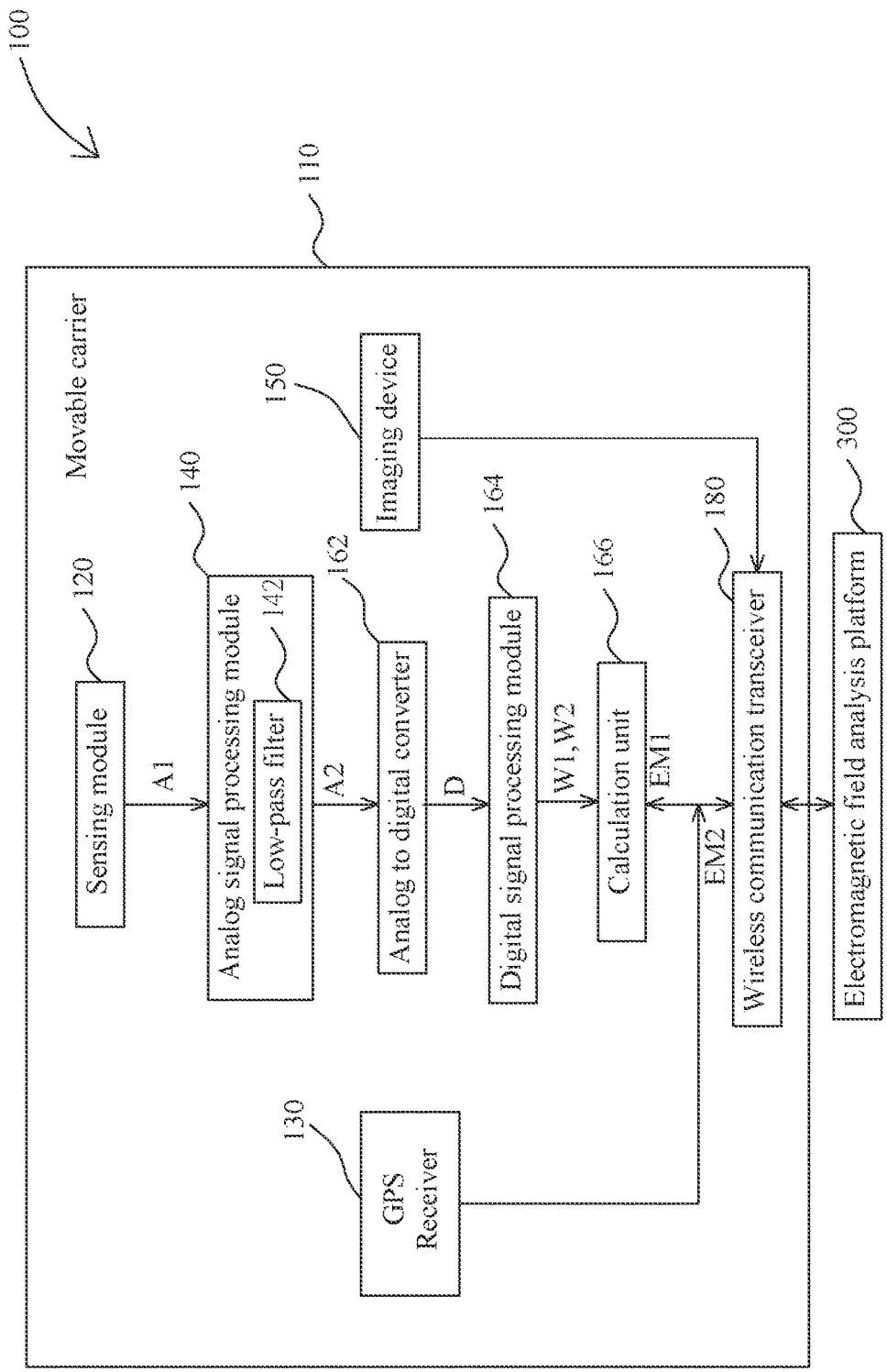
FIG. 2 is a block diagram of an electromagnetic field measurement system according to an embodiment of the present invention.

FIG. 2 is an electromagnetic field measurement system 100 according to an embodiment of the present invention, which is suitable for executing the flow chart shown in FIG. 1. The electromagnetic field measurement system 100 includes a sensing module 120, an analog signal processing module 140, an analog-to-digital converter 162, a digital signal processing module 164, and an calculation unit 166 of electromagnetic field value. The electromagnetic field measurement system 100 is suitable for installation in a movable carrier 110, such as vehicles, aircrafts or drones, to measure the electric field or/and the magnetic field in the environment.

The sensing module 120 includes an electric field sensor, a magnetic field sensor or their combination to sense the electromagnetic field at a spatial position in the environment to generate a sensing signal A1. The sensing signal A1 may include an electric field vector or/and a magnetic field vector at any point in space. In one embodiment, the measuring target of the electromagnetic field measurement system 100 is the environmental electromagnetic field around electricity places such as power plants, wind turbines, transmission and distribution lines, electrical towers, substations, power test laboratories, or railway electrification system. Generally, the environmental electromagnetic fields around these electricity places include the electromagnetic field with a frequency of 50 Hz/60 Hz and/or integer multiples thereof. It should be noted that the present invention is not used to detect the electromagnetic field of the earth.

The analog signal processing module 140, such as an electric field signal processing circuit or/and a magnetic field signal processing circuit, includes a low-pass filter 142, to receive the sensing signal A1 from the sensing module 120 and filter out a high-frequency interference in the sensing signal A1, while retaining a first filter signal A2. The frequency of the high-frequency interference is greater than a first frequency, and the first frequency is determined according to the electromagnetic field generated by the motor operation of the movable carrier such as an unmanned aerial vehicle (referred to as UAV) or drones. For example, the frequency of the electromagnetic field generated by the motor operation of the UAV is usually above 4 kHz, so that the analog signal processing module may employ the low-pass filter 142 to filter out an interference signal with a frequency greater than 4 kHz of the sensing signal A1.

The embodiment implements the digital signal processing mechanism (S30) shown in FIG. 1 through the analog-to-digital converter 162, the digital signal processing module 164, and the calculation unit 166 of electromagnetic field value. The analog-to-digital converter 162 is employed to convert the first filter signal A2 provided by the analog signal processing module 140 into a digital signal D. The digital signal processing module 164 performs Fourier transform on the digital signal D to extract a fundamental wave W1 and harmonic waves W2, thereby realizing the second stage of filtering. The calculation unit 166 of electromagnetic field value calculates an ambient electromagnetic field value EM1 of the spatial position based on the fundamental wave W1 and the harmonic waves W2. For example, the calculation unit 166 provides a wave equation including the calculation relationship between the fundamental wave, harmonic wave and electric field value; or another wave equation includes the calculation relationship between fundamental wave, harmonic wave and magnetic field value.

$$\text{Electromagnetic field value} = \sqrt{\sum_1^N Q_n^2}$$

Where $Q_n$ (n is a harmonic order equal to 1) is the fundamental wave component of the electric or magnetic field value, which is an effective value expressed by Root Mean Square (referred to as RMS).

$Q_n$ (n is a harmonic order including an integer greater than 1) is the harmonic component of the electric or magnetic field value, which is expressed as an effective value expressed by RMS. For example, $Q_2$ is the second harmonic whose frequency is two times the fundamental frequency; $Q_3$ is the third harmonic whose frequency is three times the fundamental frequency.

N is the range of fundamental wave component and harmonic components selected by the operator.

In the embodiment, the movable carrier 110 is further equipped with a Global Positioning System (referred to as GPS) receiver 130 and an imaging device 150 such as a camera. The GPS receiver 130 is employed to receive a satellite positioning information of the spatial position, and mark the satellite positioning information on the ambient electromagnetic field value EM1 to form a marked data EM2 including the ambient electromagnetic field value with positioning information. Subsequently, the marked data EM2 is transmitted to an electromagnetic field analysis platform 300 through a wireless communication transceiver 180 for use by operators. In addition, the image generated by the imaging device 150 is also transmitted back to the electromagnetic field analysis platform 300 via the wireless communication transceiver 180, so that the operator can perform remote control in real time.

Figure 3:
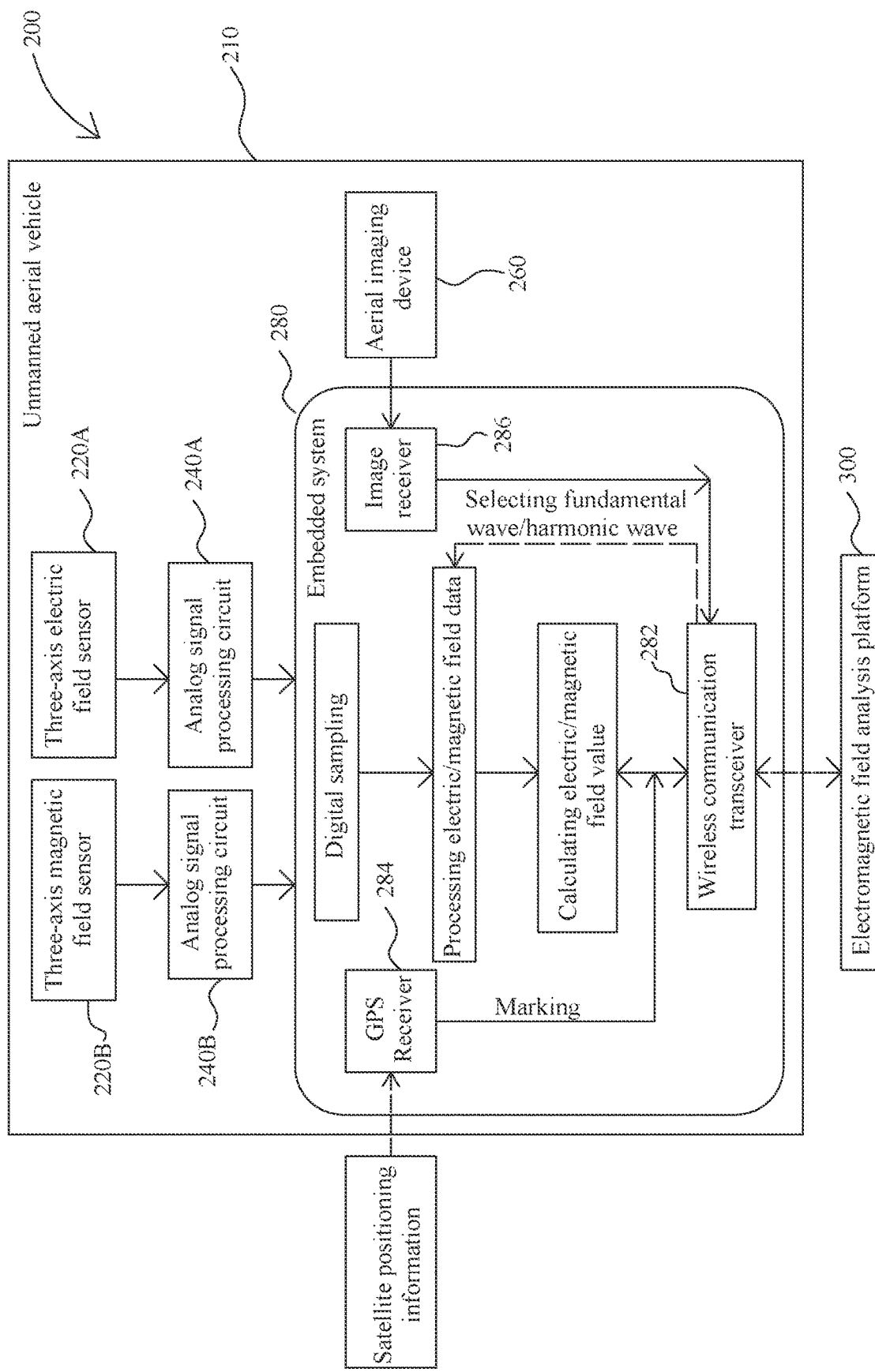
FIG. 3 is a block diagram of an electromagnetic field measurement system according to another embodiment of the present invention.

FIG. 3 is another embodiment of an electromagnetic field measurement system 200 of the present invention, which is mounted on the unmanned aerial vehicle 210 for environmental electromagnetic field measurement. The electromagnetic field measurement system 200 includes: (a) a three-axis electric field sensor 220A and its analog signal processing circuit 240A; (b) a three-axis magnetic field sensor 220B and its analog signal processing circuit 240B; (c) an aerial imaging device 260; and (d) an embedded system 280. The individual descriptions are as follows:

(a) Three-Axis Electric Field Sensor 220A and its Analog Signal Processing Circuit 240A The three-axis electric field sensor 220A is used to sense the electric field vector at any point in the space. However, during the sensing process, The three-axis electric field sensor 220A must suffer from the electric field interference of the UAV 210. The electric field interference may come from the operation of all circuits on the UAV 210, and the main source is the rotor motor. Because most of these interferences are in the high-frequency band above 4 kHz, the embodiment provides the analog signal processing circuit 240A, which includes a low-pass filter to remove the electric field interferences of the high-frequency band from the sensing signal generated by the three-axis electric field sensor 220A.

(b) Three-Axis Magnetic Field Sensor 220B and its Analog Signal Processing Circuit 240B The three-axis magnetic field sensor 220B is used to sense the magnetic field vector at any point in the space. However, during the sensing process, the three-axis magnetic field sensor 220B must suffer from the magnetic field interference of the UAV 210. The magnetic field interference may come from the operation of all circuits on the UAV 210, and the main source is the rotor motor. Since most of these magnetic field interferences are in the high-frequency band above 4 kHz, the embodiment provides the analog signal processing circuit 240B, which includes a low-pass filter to remove the magnetic field interferences of the high-frequency band from the sensing signal generated by the three-axis magnetic field sensor 220B.

(c) Aerial Imaging Device 260

A measured region of environmental electromagnetic field usually covers a large area. Therefore, the aerial imaging device 260 is disposed on the UAV 210 for the operator to wirelessly remotely control the UAV 210 to perform electromagnetic field measurement of a wide range.

(d) Embedded System 280

In the embodiment, the embedded system 280 is employed to execute the digital signal processing mechanism (S30) shown in FIG. 1. The first step is to digitally sample the magnetic field signal and the electric field signal output from the analog signal processing circuits 240A and 240B and convert them into digital signals including the digitalized magnetic field data and/or electric field data. Next, the second stage of filtering with Fourier Transform is performed to process the digitalized magnetic field data and electric field data, so as to retain the magnetic or/and electric field data of the fundamental wave with a frequency that matches the electrical power fundamental frequency in the measured region, and also retain the magnetic or/and electric field data of harmonic waves with frequencies that are integer multiples of the above electrical power fundamental frequency.

The embedded system 280 is connected to an electromagnetic field analysis platform 300 through wireless communication. Before performing the Fourier transform, the operator may predetermine the frequency of the magnetic field data and electric field data through the electromagnetic field analysis platform 300. For example, the fundamental frequency of the power system is generally 50 Hz or 60 Hz. When the selected fundamental frequency is 50 Hz, the corresponding harmonic frequencies is n times 50 Hz; while the fundamental frequency is selected as 60 Hz, the corresponding harmonic frequency is n times 60 Hz, where n is the harmonic order that is an integer equal to or greater than 1. Subsequently, the Fourier transform is applied to process the digital signal according to the selected fundamental frequency and harmonic order, to extract the fundamental wave matching the selected fundamental frequency and the harmonic waves matching the harmonic frequencies that are integer multiples of the selected fundamental frequency. In the embodiment, the frequencies of the fundamental wave and the harmonic waves are in the range of 50 Hz to 4 kHz; in other words, the harmonic order n is an integer in the range of 1 to 64 when the fundamental frequency is 50 Hz or 60 Hz. The embedded system 280 implements the second stage of filtering through the above process. The obtained fundamental waves and harmonic waves are used to calculate the ambient electromagnetic field value, and then the calculation results are transmitted back through the wireless communication transceiver 282 to be displayed on the electromagnetic field analysis platform 300 of the operator.

Furthermore, the embedded system 280 includes a GPS receiver 284 and an image receiver 286. When the three-axis electric field sensor 220A and/or the three-axis magnetic field sensor 220B generate an electromagnetic field sensing signal of a spatial position, the GPS receiver 284 simultaneously receives a satellite positioning information of the spatial position. The satellite positioning information is marked on the calculated ambient electromagnetic field value, and the ambient electromagnetic field value marked with the satellite positioning information is sent back to and displayed on the electromagnetic field analysis platform 300. The image generated by the aerial imaging device 260 is also sent back to the electromagnetic field analysis platform 300 via the image receiver 286 of the embedded system 280, so that the operator can remotely control the flight path and the staying position of the UAV 210 in real time.

The embodiment employs the UAV 210 as a carrier for the detection of environmental electromagnetic fields. The three-axis electric field sensor 220A and the three-axis magnetic field sensor 220B are both installed on the UAV 210, to overcome environmental obstacles during the measurement process and accomplish smoothly the environmental electromagnetic field measurement. The UAV 210 is equipped with the GPS receiver 284, which enables the calculated environmental electromagnetic field value to mark positioning information to complete the electromagnetic field measurement of the whole measured region.

In addition, the UAV 210 itself may generate electromagnetic field interference, which affects the sensing signal of the three-axis electric field sensor 220A and the three-axis magnetic field sensor 220B. Therefore, the present invention provides a solution to the electromagnetic field interference of the UAV 210 itself. It uses two-stage filtering: 1) the first stage is to filter out the high-frequency electromagnetic field interference generated by the operation of the UAV 210 from the sensing signals output by the three-axis electric field sensor 220A and the three-axis magnetic field sensor 220B; 2) the second stage is to perform Fourier transformation through the embedded system 280, to retain the digital signal with frequencies matching the electrical power fundamental frequency and its corresponding harmonic frequencies, thereby filtering out the low-frequency interference generated by the operation of the UAV 210 itself.

Through the two-stage filtering, the measured data only related with the environmental electromagnetic field can be extracted from the sensing signal. For example, the fundamental wave of electric power and its corresponding harmonic waves are extracted through the two-stage filtering, and sent to the operator by wireless communication. The UAV 210 is designed to employ the aerial imaging device 260, so that the operator may remotely control the UAV 210 wirelessly to perform the electromagnetic field measurement of wide range.

In summary, performing the method of the present invention to measure environmental electromagnetic field may obtain relatively stable and accurate measurement data of environmental electromagnetic field. Accordingly, the present invention have different technical features from the traditional technology, and it is difficult for a person having ordinary skill in the art to come up with the concept of the present invention based on the teaching of the traditional technologies, so the present invention should conform to novelty and non-obviousness.

The foregoing descriptions of the preferred embodiments of the present invention have been provided for the purposes of illustration and explanations. It is not intended to be exclusive or to confine the invention to the precise form or to the disclosed exemplary embodiments. Accordingly, the foregoing descriptions should be regarded as illustrative rather than restrictive. Obviously, many modifications and variations will be apparent to professionals skilled in the art. The embodiments are chosen and described in order to best explain the principles of the invention and its best mode for practical applications, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary to confine the scope defined by the claims to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules on the requirement of an abstract for the purpose of conducting survey on patent documents, and should not be used to interpret or limit the scope or meaning of the claims. Any advantages and benefits described hereto may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for measuring environmental electromagnetic field, comprising: steps of:
   disposing an electromagnetic field measurement system on a movable carrier, wherein the electromagnetic field measurement system comprises a sensing module, an analog signal processing module, and a digital signal processing mechanism, wherein the sensing module is selected from the group consisting of an electric field sensor, a magnetic field sensor and a combination thereof to sense an environmental electromagnetic field of a spatial position to generate a sensing signal;

having the analog signal processing module remove a high-frequency interference from the sensing signal to retain a first filtered signal, wherein the high-frequency interference has a frequency greater than a first frequency value, and the first frequency value is determined according to an electromagnetic field generated from the operation of the movable carrier itself; and performing the digital signal processing mechanism, comprising steps of:
  converting the first filtered signal into a digital signal;
  removing a low-frequency interference from the digital signal to form a second filtered signal, wherein the low-frequency interference has a frequency less than a predetermined second frequency value; and
  calculating a measured value of the environmental electromagnetic field of the spatial position according to the second filtered signal.

2. The method according to claim 1, wherein the first frequency value is 4 kHz, and the predetermined second frequency value is selected from one of 50 Hz and 60 Hz.

3. The method according to claim 1, wherein forming the second filtered signal comprises steps of:
  defining the predetermined second frequency value as a fundamental frequency of a power system;
  determining a harmonic order corresponding to the fundamental frequency of the power system; and
  performing Fourier transform on the digital signal to obtain at least one wave according to the fundamental frequency and the harmonic order.

4. The method according to claim 3, wherein the at least one wave obtained by performing Fourier transform has a frequency in the range of 50 Hz to 4 kHz.

5. The method according to claim 1, further comprising:
  receiving a satellite positioning information of the spatial position when generating the sensing signal; and
  marking the satellite positioning information on the measured value of the environmental electromagnetic field.

6. The method according to claim 5, wherein the digital signal processing mechanism is executed by an embedded system.

7. The method according to claim 6, further comprising:
  disposing an imaging device on the movable carrier; and
  implementing an image receiver in the embedded system, wherein the image receiver is electrically connected to the imaging device.

8. The method according to claim 7, further comprising:
  disposing a global positioning system receiver in the embedded system to receive the satellite positioning information.

9. The method according to claim 6, further comprising:
  providing an electromagnetic field analysis platform to be connected with the embedded system through wireless communication;
  predetermining a fundamental frequency and a harmonic order by the electromagnetic field analysis platform;
  performing Fourier transform on the digital signal to extract the second filtered signal according to the fundamental frequency and the harmonic order through the embedded system; and
  displaying the measured value of the environmental electromagnetic field on the electromagnetic field analysis platform after the measured value of the environmental electromagnetic field is marked with the satellite positioning information.

10. The method according to claim 1, wherein the movable carrier comprises an unmanned aerial vehicle, and the analog signal processing module comprises a low pass filter.

* * * * *